United States Patent
Mucci et al.

(10) Patent No.: US 6,856,496 B1
(45) Date of Patent: Feb. 15, 2005

(54) SOLAR TILE ASSEMBLY

(75) Inventors: Peter E. R. Mucci, Southampton (GB); Abubakr S. Bahaj, Southampton (GB); Patrick A. B. James, Southampton (GB); James R. Ballard, Southampton (GB)

(73) Assignee: Powertile Ltd, Durley (GB)

( * ) Notice: Subject to any disclaimer, the term of this patent is extended or adjusted under 35 U.S.C. 154(b) by 0 days.

(21) Appl. No.: 09/980,471

(22) PCT Filed: Jun. 14, 2000

(86) PCT No.: PCT/GB00/02159

§ 371 (c)(1),
(2), (4) Date: Mar. 26, 2002

(87) PCT Pub. No.: WO00/77860

PCT Pub. Date: Dec. 21, 2000

(30) Foreign Application Priority Data

Jun. 14, 1999 (GB) .............................. 9913705

(51) Int. Cl.[7] .............................................. H01L 31/00
(52) U.S. Cl. .......................... 361/20; 136/244; 439/376
(58) Field of Search .......................... 361/20, 683, 773; 136/244, 251, 291–293; 439/374, 376, 929; 323/8, 722, 299, 906

(56) References Cited

U.S. PATENT DOCUMENTS 4,139,399 A * 2/1979 Lindmayer ................... 136/251
4,392,009 A * 7/1983 Napoli ......................... 136/251
5,092,939 A * 3/1992 Nath et al. ................... 136/251
5,232,518 A   8/1993 Nath et al.
6,111,189 A * 8/2000 Garvison et al. ............ 136/244
6,515,215 B1 * 2/2003 Mimura ....................... 136/244

FOREIGN PATENT DOCUMENTS

| JP | 03-25146   | 2/1991  |
| JP | 09-312175  | 12/1997 |
| JP | 10-88740   | 4/1998  |
| JP | 11-22127   | 1/1999  |

* cited by examiner

Primary Examiner—Brian Sircus
Assistant Examiner—Danny Nguyen
(74) Attorney, Agent, or Firm—Christensen O'Connor Johnson Kindness PLLC

(57) ABSTRACT

A solar tile assembly (1A) comprises a removable rectangular outer panel (1) that comprises ten photovoltaic cells (3) disposed on the outermost surface thereof, and a substantially rectangular inner support structure (2). The photovoltaic cells (3) cover the lower portion of the outer panel (1). Any suitable photovoltaic means may be used for the solar tile assembly. The outer panel (1) is secured to the inner support structure (2) using two fasteners (5a, 5b) disposed at the front end of the solar tile assembly (1A). The fasteners (5a, 5b) may typically be quarter or half turn captive fasteners. These types of fasteners have the added advantage of being retained by the outer panel (1) during assembly/disassembly processes. The inner support structure (2) comprises a framework at one end of which there is formed a lower stepped interlockable section (4). In use the interlockable section (4) is disposed under a portion of an adjacent tile assembly, as is well known in the art of roof tile design.

17 Claims, 5 Drawing Sheets

SOLAR TILE ASSEMBLY

CROSS-REFERENCES TO RELATED APPLICATIONS

This is a United States national stage application of International application No. PCT/GB00/02159, filed Jun. 14, 2000, the benefit of the filing date of which is hereby claimed under 35 U.S.C. § 120, which in turn claims the benefit of United Kingdom application No. 9913705.1, filed Jun. 14, 1999, the benefit of the filing date of which is hereby claimed under 35 U.S.C. § 119.

FIELD OF THE INVENTION

The present invention relates to a solar tile assembly and is concerned particularly with a two part solar roofing tile and a method for providing electrical connection between the respective parts of the two part solar roofing tile.

BACKGROUND OF THE INVENTION AND DESCRIPTION OF THE RELATED ART

It is known to use solar panels comprising photovoltaic modules that may be placed onto the exterior of a building or replace the existing roof tiles. Examples of such photovoltaic modules are described in U.S. Pat. No. 5,590,495, U.S. Pat. No. 5,112,408 and EP 0710806. The photovoltaic modules systems normally comprise a plurality of solar panels that are electrically connected to form a circuit. The solar panels may require routine maintenance that necessitates the removal of one or more of the solar panels.

SUMMARY OF THE INVENTION

According to a first aspect of the present invention there is provided a solar tile assembly comprising a removable outer panel that comprises photovoltaic means and a first electrical connector, and an inner support structure that comprises a second electrical connector, the arrangement being such that, in use, bringing together the outer panel and the inner support structure causes the first electrical connector and the second electrical connector to be brought together into an electrical connection between said first electrical connector and said second electrical connector and wherein the outer panel is slidably attached to the inner support structure by attachment means comprising a channel section formed to receive an attachment element and wherein the outer panel is adapted to be removed from the inner support structure by first sliding the outer panel in a direction that is substantially parallel to a plane of an outermost surface of the outer panel so as to align the attachment element with an access port provided in the channel section between the distal ends of the channel section and by then lifting the outer panel in a direction perpendicular to the direction of sliding.

The electrical connection between the first electrical connector and the second electrical connector is preferably broken by the removal of the outer panel from the inner support structure.

Preferably, the outer panel is slidably attached to the inner support structure by attachment means comprising a channel section formed to receive an attachment element.

The outer panel conveniently comprises a pair of attachment elements and the inner support structure is formed with a pair of channels for receiving and retaining the attachment elements of the outer panel.

The electrical connection between the first electrical connector and the second electrical connector is preferably broken by sliding the outer panel in a direction that is substantially parallel to plain of outermost surface of the outer panel.

In use the inner support structure can be attached to the outer surface of a structure such as a building. If necessary a damaged outer panel can be easily removed from the solar tile assembly whilst still leaving the inner support structure fixed to the building. A new outer panel can then replace the damaged outer panel. Also, the outer panel and the inner support structure can be easily inspected by removing the outer panel.

The inner support structure preferably comprises an electrical junction box comprising the second electrical connector.

The electrical junction box of the inner support structure preferably comprises an electrical input terminal and an electrical output terminal, the arrangement being such that the electrical input terminal and the electrical output terminal provide electrical communication between corresponding solar tile assemblies. In use the photovoltaic means of the respective solar assemblies generate electrical energy and there may be an electrical network provided between the plurality of solar title assemblies.

It is preferable that the outer panel comprises an electrical junction box formed with the first electrical connector, the arrangement being such that in the assembled state of the solar tile assembly the first connector and the second connector provide electrical communication between the two electrical junction boxes.

The solar tile assemblies may be conveniently fixed to roof battens of a conventional roof structure and may replace the roofing tiles.

According to an embodiment of the first invention the support structure comprises means for providing electrical connections between adjacent solar tile assemblies.

The means for providing electrical connections between adjacent solar tile assemblies preferably comprises an electrical connector on opposite sides of the support structure.

According to a second aspect of the present invention there is provided a removable solar tile comprising photovoltaic means and an electrical connector, the arrangement being such that, in use, bringing the solar tile together with an inner support structure causes the first electrical connector and a second electrical connector of the inner support structure to be brought together into an electrical connection between said first electrical connector and said second electrical connector and wherein the solar tile is slidably attached to the inner support structure by attachment means comprising a channel section formed to receive an attachment element and wherein the solar tile is adapted to be removed from the inner support structure by first sliding the solar tile in a direction that is substantially parallel to a plane of an outermost surface of the solar tile so as to align the attachment element with an access port provided in the channel section between the distal ends of the channel section and by then lifting the solar tile in a direction perpendicular to the direction of sliding.

According to a third aspect of the present invention there is provided an inner support structure for a removable tile comprising photovoltaic means, the inner support structure comprising an electrical connector, the arrangement being such that, in use, bringing the removable tile together with the inner support structure causes the electrical connector of the inner support structure and the electrical connector of the removable tile to be brought together into an electrical connection between said electrical connectors and wherein the removable tile is slidably attached to the inner support structure by attachment means comprising a channel section formed to receive an attachment element and wherein the removable tile is adapted to be removed from the inner support structure by first sliding the removable tile in a direction that is substantially parallel to a plane of an outermost surface of the removable tile so as to align the attachment element with an access port provided in the channel section between the distal ends of the channel section and then lifting the removable tile in a direction perpendicular to the direction of sliding.

Preferably the electrical connection between the respective parts of the solar tile assembly is broken by sliding the outer panel in the opposite direction.

The invention may include any combination of the features or limitations referred to herein.

BRIEF DESCRIPTION OF THE DRAWINGS

The invention can be put into practice is various ways, but an embodiment will now be described by way of example only with reference to the accompanying drawings in which.

DETAILED DESCRIPTION OF THE PREFERRED EMBODIMENT

Figure 1:
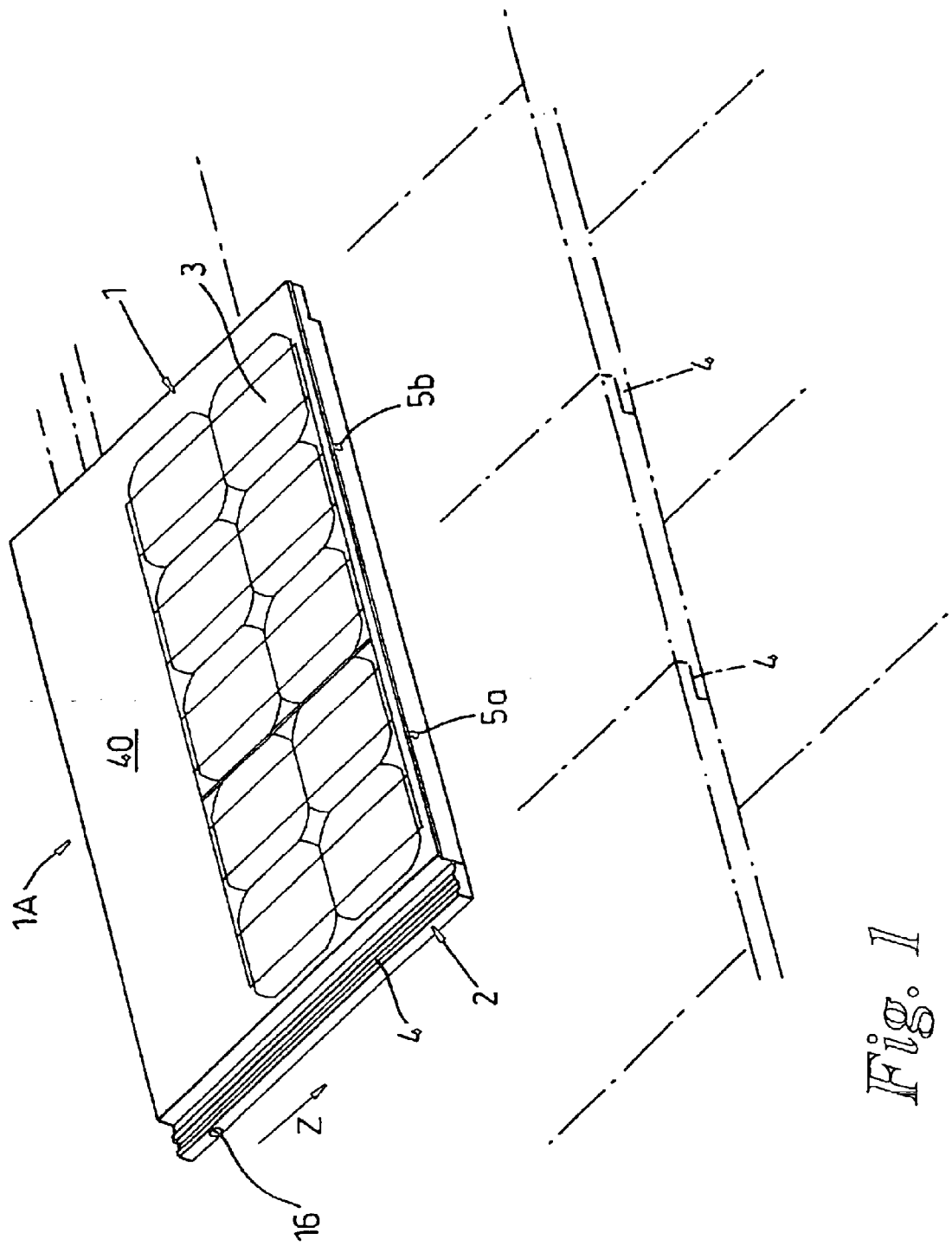
FIG. 1 is an isometric view of a solar tile assembly in a closed assembled condition.

With reference to the FIGS. 1 to 5, a solar tile assembly 1A comprises a removable rectangular outer panel 1 that comprises ten photovoltaic cells 3 disposed on the outermost surface thereof, and a substantially rectangular inner support structure 2. The photovoltaic cells 3 cover the lower portion of the outer panel 1. Any suitable photovoltaic means may be used for the solar tile assembly.

The outer panel 1 is secured to the inner support structure 2 using two fasteners 5a, 5b disposed at the front end of the solar tile assembly 1A. The fasteners 5a, 5b may typically be quarter or half turn captive fasteners. These types of fasteners have the added advantage of being retained by the outer panel 1 during assembly/disassembly processes.

The inner support structure 2 comprises a framework at one of which there is formed a lower stepped interlockable section 4. In use the interlockable section 4 is disposed under a portion of an adjacent tile assembly, as is well known in the art of roof tile design. The inner support structure 2 is formed with three sets of holes 6. These holes 6 allow fixing nails or screws to be used to attach the inner structure 2 to roof tiling battens located underneath the inner structure 2. For certain roof designs no fixing nails or screws will be needed to hold the tile assembly 1A onto the roof. Disposed within the frame of the support structure 2 there is an electrical junction box 7. The inner support structure 2 comprises two parallel end members 7a, 7b (shown in FIGS. 3 to 5). Formed within each of the respective end members 7a, 7b there are respective slide channels 8a, 8b. At one end of the slide channel 8a there is formed a cutaway access port 9a. At the corresponding end of the slide channel 8b (not shown) there is formed a cutaway access port 9b.

Figure 5:
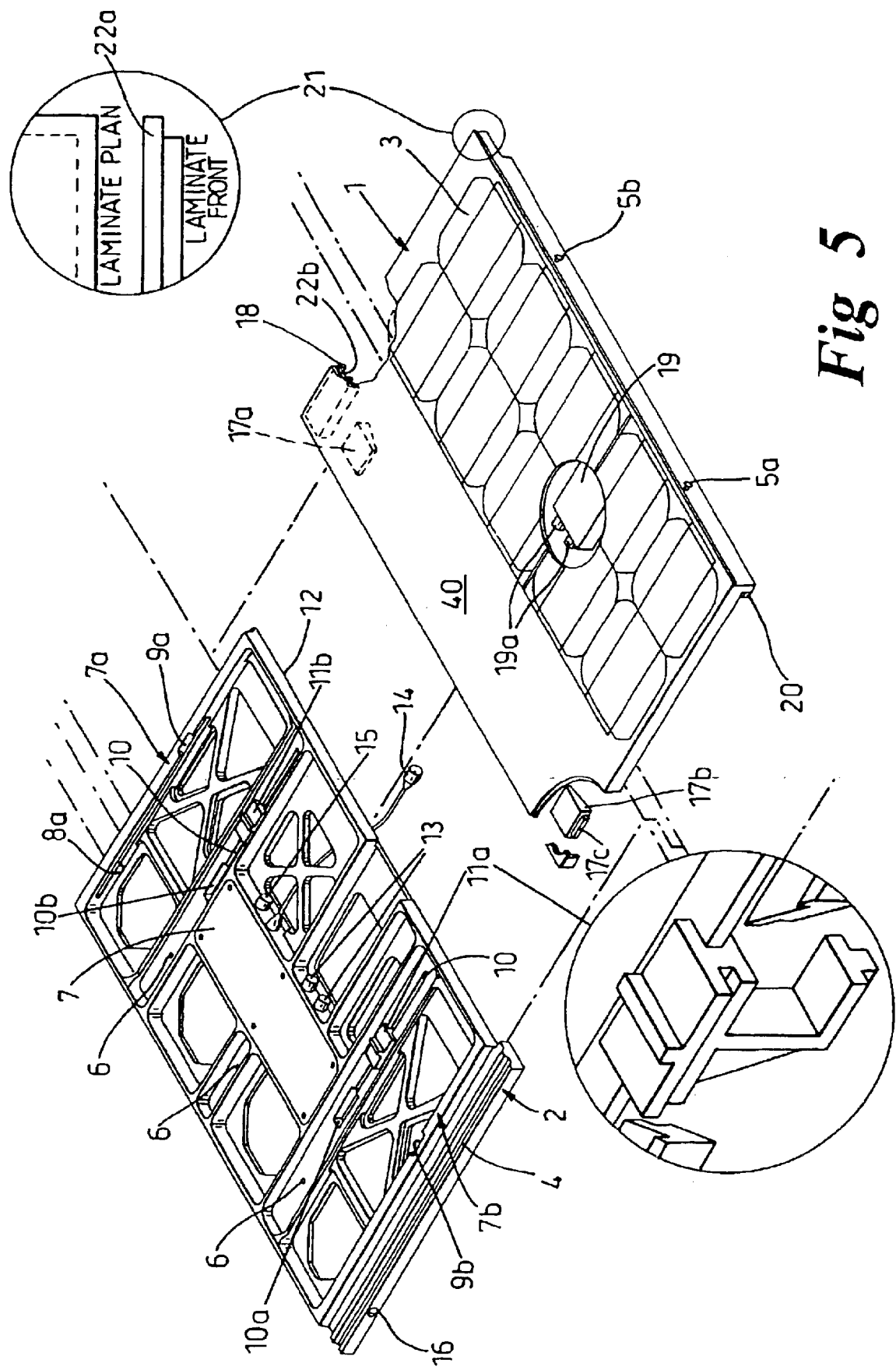
FIG. 5 is an isometric view of the solar tile assembly shown in FIG. 1 and shows more detail of a variable gauge clip, more detail of the outer panel structure and three partial cut-away sections of the outer panel.

The outer panel 1 comprises a pair of attachment elements 17a, 17b fixed to the inner surface of the outer panel 1 (see FIG. 5). The attachment elements 17a, 17b are a triangular wedge shape. A heel portion 17c extends from each of the respective vertical faces of the wedge shapes. The attachment elements 17a, 17b are shaped to be received by the access ports 9a, 9b.

Figure 4:
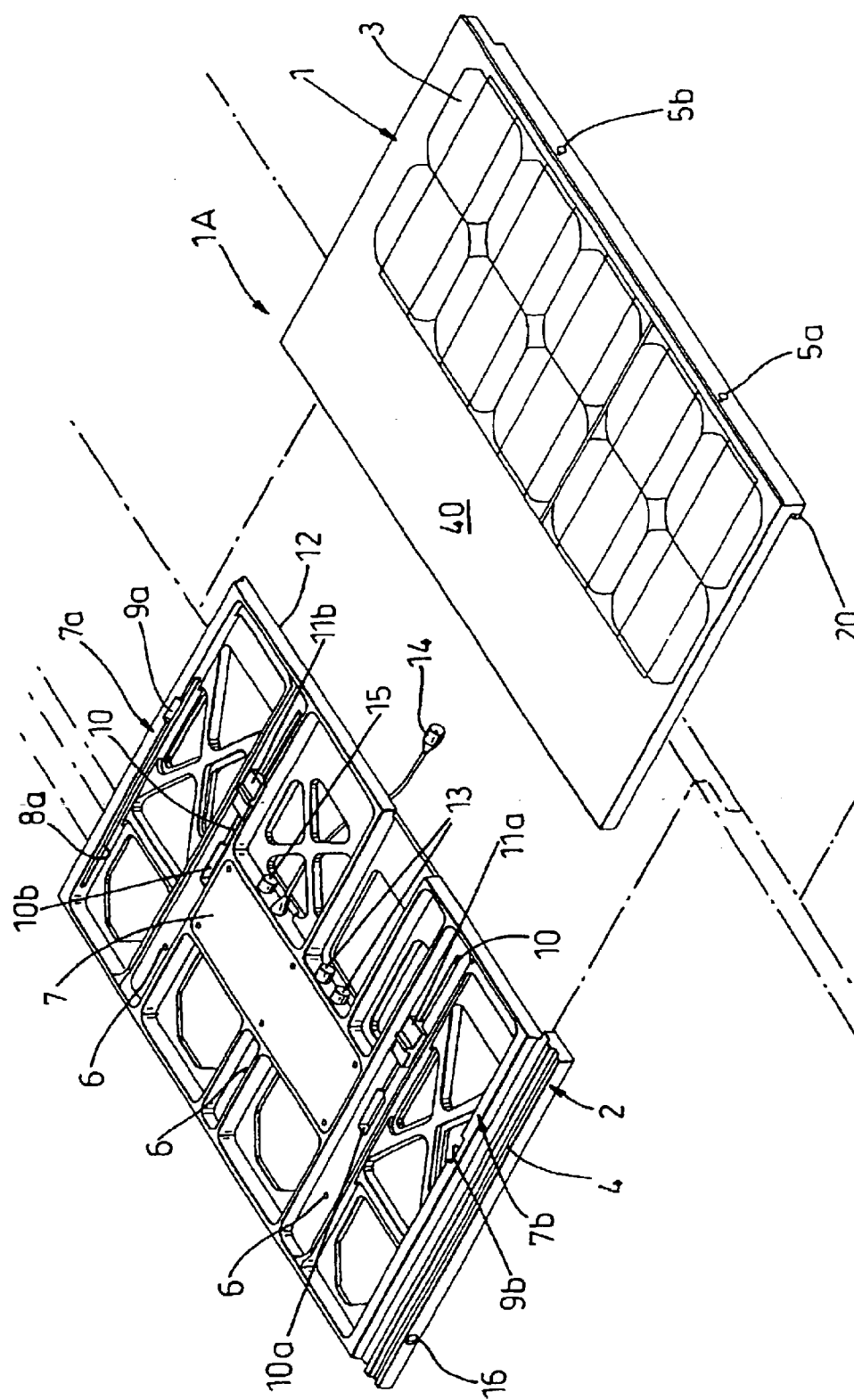
FIG. 4 is an isometric view of the solar tile assembly shown in FIG. 1 and shows the outer panel removed from the inner support frame.

Also formed in the inner support structure 2 there are two substantially parallel channels 10 (shown in FIGS. 4 and 5). At one end of each channel 10 there is provided an access port 10a, 10b. Each port 10a, 10b has a greater width than the width of the remaining portions of the respective channels 10. The ports 10a, 10b provide access to the channels 10 for two variable gauge clips 11a, 11b.

It will be appreciated by the skilled person in the art that the channels 10 may be used in place of the slide channels 8a, 8b. Channels 10 can operate to perform the function of channels 8a, 8b by comprising two sets of slide fixtures, one set being attached to the outer panel 1.

Should added retention for the solar tile assembly be required, for example in high winds, the clips 11a, 11b may slide along the channels 10 and are used to fix the outer panel 1 to an outer panel of an adjacent solar panel assembly located below.

The electrical junction box 7 of the inner support structure 2 comprises a pair of electrical connectors 13, an electrical output lead 14 and an electrical input connector 15. The outer panel 1 comprises an electrical junction box 19 that comprises a pair of electrical connectors 19a. In the assembled closed condition of the solar tile assembly 1A (as shown in FIG. 1) the electrical connectors 13 are in electrical contact with the electrical connectors 19a.

Figure 2:
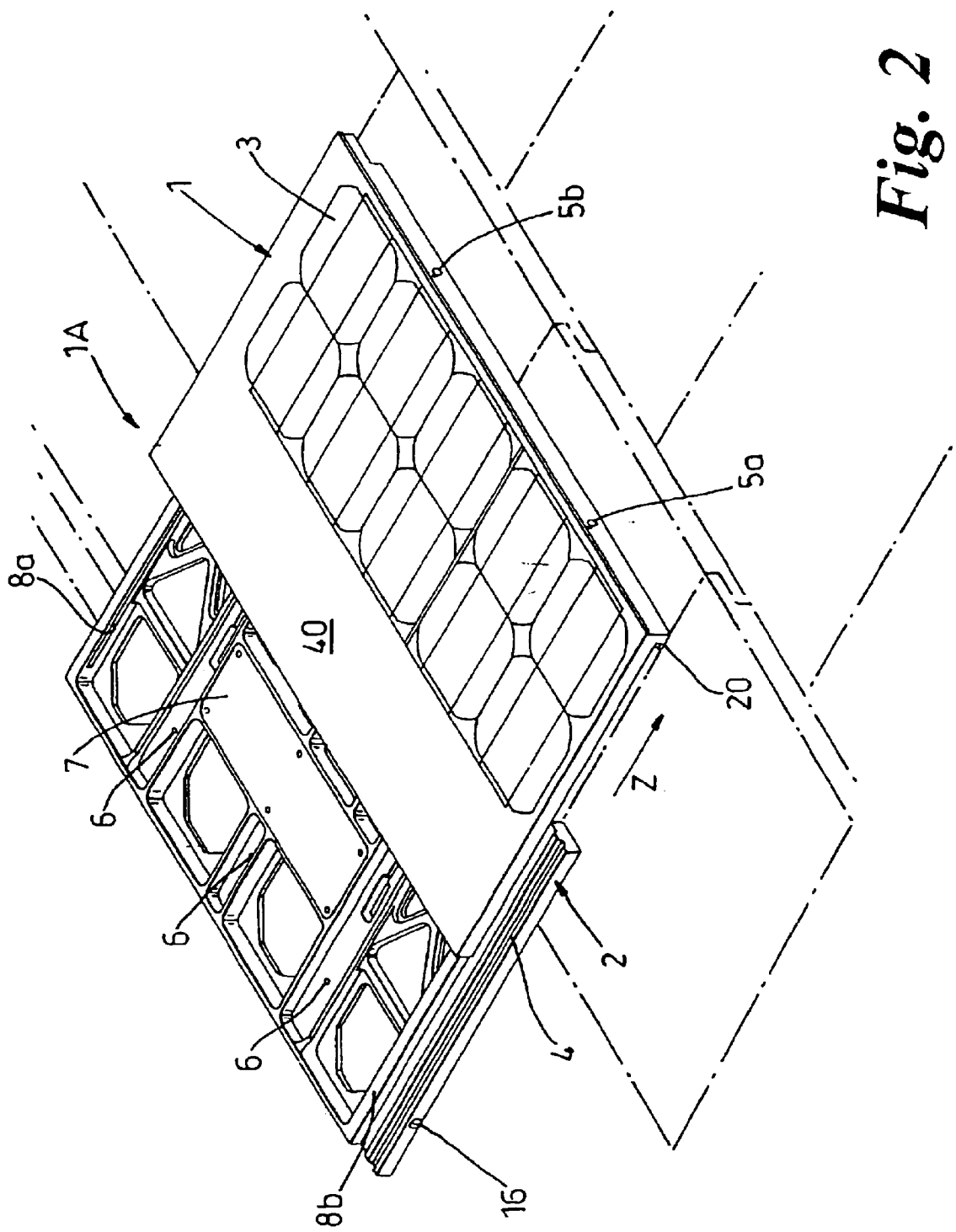
FIG. 2 is an isometric view of the solar tile assembly shown in FIG. 1 and shows the assembly in a partially open condition.
Figure 3:
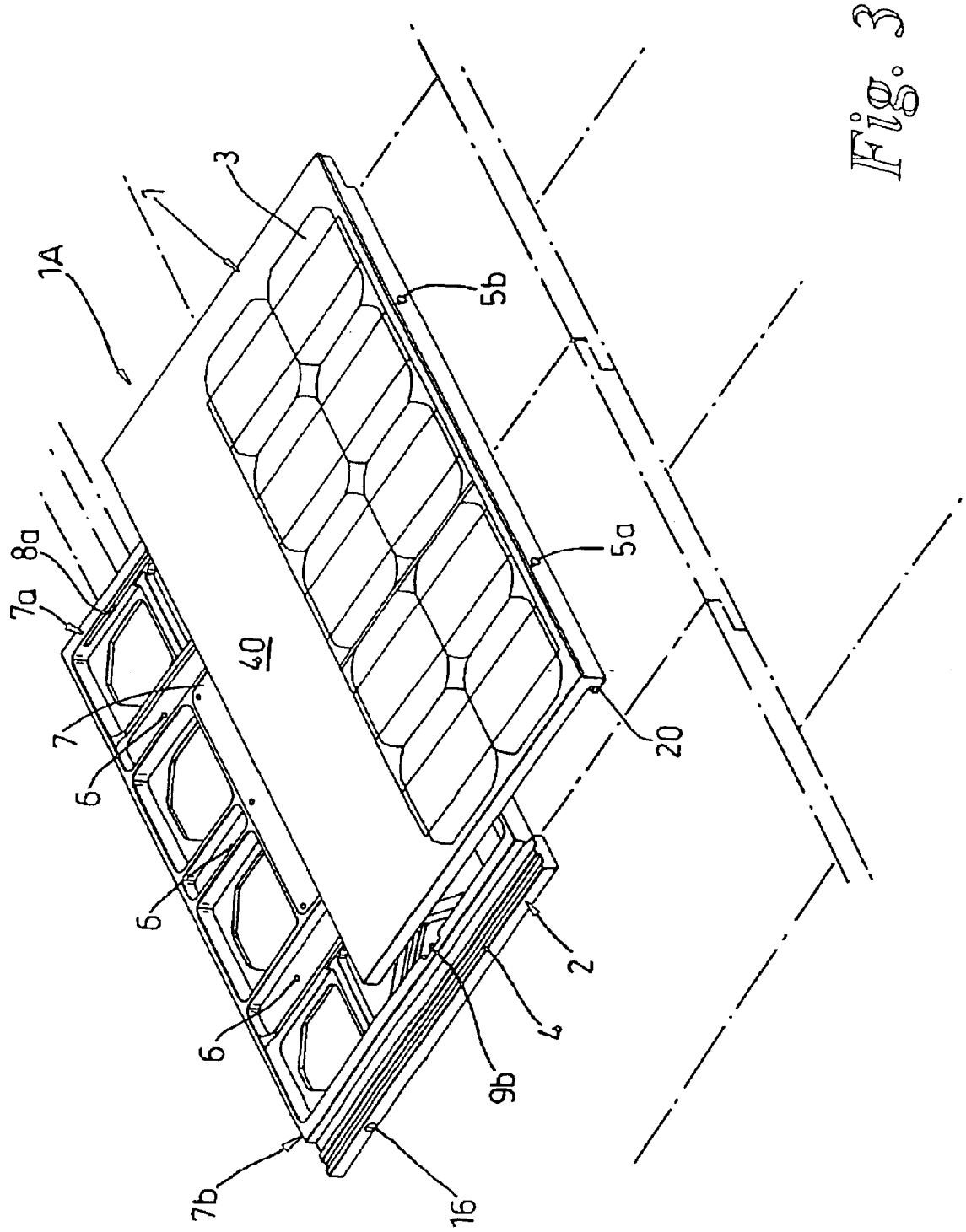
FIG. 3 is an isometric view of the solar tile assembly shown in FIG. 1 and shows the outer panel separated from the inner support frame.

To disassemble the solar tile assembly 1A the outer panel 1 is first slid in a direction Z and this causes a break in the electrical connection between the connectors 13 and the connectors 19a. The outer panel 1 is slid in the direction Z until the attachment elements 17a, 17b abut the respective lowermost ends of the channels 10. The outer panel 1 will stay in this position without sliding completely off the support structure 2 (as shown in FIG. 2). In order to separate the outer panel 1 from the inner support structure 2 the outer panel 1 is moved back a small distance in the opposite direction to direction Z until the attachment elements 17a, 17b align with the respective access ports 9a, 9b. The outer panel 1 can then be lifted away from the inner support structure 2 (as shown in FIG. 3).

When the solar tile assembly 1A is reassembled and the outer panel 1 is slid back up into position, the inwardly-extending lip 20 on the front underside of the outer panel 1 fits under a recess 12 that is formed in the lowermost edge of the inner support structure 2 so providing secure anchorage against high wind.

The outer panel 1 is constructed typically of two planar sheets of material (see FIG. 5). The uppermost sheet is a transparent material 22a that permits sunlight to reach the photovoltaic elements. In the embodiment shown, the uppermost sheet 22a is larger on three sides than the lowermost sheet 22b and all the fixing arrangements are mounted underneath and inside this area. Hence, no joints exist which could cause water ingress when exposed to the weather. The materials that may be used for the construction of the parts of the solar tile assembly 1A include metallic or non-metallic including plastics, glass, metal and ceramics/clay/cement.

The underside of the inner support structure 2 has location points to allow it to be easily positioned on the roof of a building and also to retain it in position whilst fixing down. The variable gauge clips 11a, 11b may be used to fix the outer panel 1 to a tile assembly located in a row below, should added retention be required for example in high wind speed areas.

The electrical connection between the outer panel 1 and the inner support structure 2 of the solar tile assembly 1A is made as the outer panel 1 is assembled onto the inner support structure 2. The electrical connection between the outer panel 1 and the inner support structure 2 of the solar tile assembly 1A is broken as the outer panel 1 is disassembled from the inner support structure 2.

It will be noted by those skilled in the art that electrical connection between the outer panel 1 and the inner support structure 2 can be broken without the complete separation of the parts because the outer panel 1 has a sliding arrangement with the inner support structure 2.

When the solar tile assembly 1A is assembled, the electrical connection between the connectors 13 and the connectors 19a is retained by use of fasteners 5a, 5b located on the front edge of the outer panel 1. When the fasteners 5a, 5b are undone and outer panel 1 is released the electrical connection will be broken as the outer panel 1 slides in direction Z. When the outer panel 1 stops at the lower part of the channels 10 the junction box 7 will be exposed, therefore allowing access to all necessary electrical components.

Flying leads 14 may be used to connect adjacent solar tile assemblies together to complete a circuit. Fixed connections 16 may also be used on the sides of the inner support structure 2 such that as a solar tile assembly is positioned adjacent to another solar tile assembly, an electrical connection can be made because the two parts of the connector 16 (male and female) are integral with the parts of adjacent tiles assemblies.

As a row of tile assemblies is completed in the horizontal plane and the next row started, a cable would normally have to run from the end of the last row along the roof to the start of the second row. This uses a considerable amount of cable and therefore incurs electrical losses. An alternative arrangement may be made where the wiring of the connections is reversed in alternate rows. The end tile assembly can then be directly connected with a short wire to the next row above or below. In order to distinguish between the tile assemblies with the two types of wiring, the inner support structure 2 of the tile assembly may be colour coded so that during assembly it is easy to lay alternative rows with the correct wiring arrangement.

The dimensions of the solar panel assembly 1A can be made to correspond with the dimensions of conventional roof tiles. Hence, the solar tile assembly can be easily fitted onto an existing roof. The roof may be partially covered by an array of solar tile assemblies and partially covered by conventional roof tiles. Due to the construction and configuration of the solar tile assembly 1A, the outer panel 1 of an assembly 1A can be removed from the array of assemblies without disturbing the other assemblies.

When there is an array of assemblies, the upper portion 40 of the outer panel 1 that is not formed with photovoltaic cells 3 because this area is normally covered by a lower portion of an upper adjacent solar tile assembly.

It will be appreciated that the solar tile assembly can be attached to any suitable structure outside or inside a building.

What is claimed is:

1. A solar tile assembly comprising a removable outer panel that comprises photovoltaic means and a first electrical connector, and an inner support structure that comprises a second electrical connector, wherein bringing together the outer panel and the inner support structure causes the first electrical connector and the second electrical connector to be brought together into an electrical connection between said first electrical connector and said second electrical connector, and wherein the outer panel is slidably attached to the inner support structure by attachment means comprising a channel section formed to receive an attachment element and wherein the outer panel is adapted to be removed from the inner support structure by first sliding the outer panel in a direction that is substantially parallel to a plane of an outermost surface of the outer panel so as to align the attachment element with an access port provided in the channel section between distal ends of the channel section and by then lifting the outer panel in a direction perpendicular to the direction of sliding.

2. A solar tile assembly as claimed in claim 1, wherein the electrical connection between the first electrical connector and the second electrical connector is broken by the removal of the outer panel from the inner support structure.

3. A solar tile assembly as claimed in claim 1, wherein the outer panel comprises the attachment element and the inner support structure is formed with the channel section for receiving and retaining the attachment element of the outer panel.

4. A solar tile assembly as claimed in claim 3, wherein the outer panel comprises a pair of attachment elements and the inner support structure is formed with a pair of channels for receiving and retaining the attachment elements of the outer panel.

5. A solar tile assembly as claimed in claim 1, wherein the electrical connection between the first electrical connector and the second electrical connector is broken by sliding the outer panel in a direction that is substantially parallel to the plane of the outermost surface of the outer panel.

6. A solar tile assembly as claimed in claim 1, wherein, in use, the inner support structure can be attached to an outer surface of a building or attached to an independent support structure located inside or outside a building.

7. A solar tile assembly as claimed in claim 1, wherein the inner support structure comprises a first electrical junction box that comprises the second electrical connector.

8. A solar tile assembly as claimed in claim 7, wherein the first electrical junction box of the inner support structure comprises an electrical input terminal and an electrical output terminal, and wherein the electrical input terminal and the electrical output terminal are adapted to provide electrical connection between corresponding solar tile assemblies.

9. A solar tile assembly as claimed in claim 7 or claim 8, wherein the outer panel comprises a second electrical junction box formed with the first electrical connector, wherein when the solar tile assembly is in an assembled state, the first connector and the second connector provide electrical connection between the first and second electrical junction boxes.

10. A solar tile assembly as claimed in claim 1, wherein the support structure comprises means for providing electrical connections between adjacent solar tile assemblies.

11. A solar tile assembly as claimed in claim 10, wherein the means for providing electrical connections between adjacent solar tile assemblies comprises an electrical connector on opposite sides of the support structure.

12. A solar tile assembly as claimed in claim 1, wherein the outer panel is configured to be capable of being slid out of a first position in which the first and second electrical connectors are connected, to a second position in which the outer panel remains attached to the support structure while exposing an underlying junction box.

13. A solar tile assembly as claimed in claim 12 in which alignment of the attachment element with the access port occurs intermediate of the first and second positions.

14. A solar tile assembly as claimed in claim 12 in which the attachment element abuts with a distal end of the channel section to define the second position.

15. A solar tile assembly as claimed in claim 1 in which the attachment means is provided underneath the removable outer panel.

16. A removable solar tile comprising photovoltaic means and a first electrical connector, the solar tile being such that, in use, bringing the solar tile together with an inner support structure causes the first electrical connector and a second electrical connector of the inner support structure to be brought together into an electrical connection between said first electrical connector and said second electrical connector and wherein the solar tile is slidably attached to the inner support structure by attachment means comprising a channel section formed to receive an attachment element and wherein the solar tile is adapted to be removed from the inner support structure by first sliding the solar tile in a direction that is substantially parallel to a plane of an outermost surface of the solar tile so as to align the attachment element with an access port provided in the channel section between distal ends of the channel section and by then lifting the solar tile in a direction perpendicular to the direction of sliding.

17. An inner support structure for a removable tile that comprises photovoltaic means, the inner support structure comprising an electrical connector, the inner support structure being such that, in use, bringing the removable tile together with the inner support structure causes the electrical connector of the inner support structure and an electrical connector of the removable tile to be brought together into an electrical connection between said electrical connectors and wherein the removable tile is slidably attached to the inner support structure by attachment means comprising a channel section formed to receive an attachment element and wherein the removable tile is adapted to be removed from the inner support structure by first sliding the removable tile in a direction that is substantially parallel to a plane of an outermost surface of the removable tile so as to align the attachment element with an access port provided in the channel section between distal ends of the channel section and by then lifting the removable tile in a direction perpendicular to the direction of sliding.

\* \* \* \* \*